(12) United States Patent
Paik et al.

(10) Patent No.: US 11,293,105 B2
(45) Date of Patent: Apr. 5, 2022

(54) METAL PLATE, DEPOSITION MASK, AND MANUFACTURING METHOD THEREFOR

(71) Applicant: LG INNOTEK CO., LTD., Seoul (KR)

(72) Inventors: Jee Heum Paik, Seoul (KR); Yoon Tai Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 326 days.

(21) Appl. No.: 16/492,535

(22) PCT Filed: Mar. 8, 2018

(86) PCT No.: PCT/KR2018/002742
§ 371 (c)(1),
(2) Date: Sep. 9, 2019

(87) PCT Pub. No.: WO2018/169250
PCT Pub. Date: Sep. 20, 2018

(65) Prior Publication Data
US 2021/0140061 A1   May 13, 2021

(30) Foreign Application Priority Data
Mar. 14, 2017   (KR) .................. 10-2017-0031938

(51) Int. Cl.
C23F 1/28       (2006.01)
C25D 7/06       (2006.01)
(Continued)

(52) U.S. Cl.
CPC .............. *C23F 1/28* (2013.01); *B32B 15/015* (2013.01); *C23C 14/042* (2013.01); *C23F 1/02* (2013.01);
(Continued)

(58) Field of Classification Search
None
See application file for complete search history.

(56) References Cited

U.S. PATENT DOCUMENTS 10,570,498 B2   2/2020  Ikenaga et al.
10,600,963 B2   3/2020  Ikenaga
(Continued)

FOREIGN PATENT DOCUMENTS

CN   103205688 A    7/2013
CN   105177496 A   12/2015
(Continued)

OTHER PUBLICATIONS

Machine translation of Naotada et al. JP 2005154879 A. (Year: 2005).*

(Continued)

*Primary Examiner* — Wojciech Haske
(74) *Attorney, Agent, or Firm* — Birch, Stewart, Kolasch & Birch, LLP

(57) ABSTRACT

A metal plate for use in manufacture of a deposition mask according to an embodiment is a multilayer metal plate having a thickness of 30 μm or less and containing an alloy of nickel (Ni) and iron (Fe), and comprises: a first outer portion occupying an area corresponding to 20% or less of the total thickness of the metal plate from one surface thereof; a second outer portion occupying an area corresponding to 20% or less of the total thickness from the other surface opposite to the one surface; and a central portion except the first outer portion and the second outer portion, wherein the first outer portion and the second outer portion each have a larger nickel content than that of the central portion. The multilayer metal plate for use in manufacture of a deposition mask according to an embodiment is a multilayer metal plate containing an alloy of nickel (Ni) and iron (Fe), and is manufactured by a method comprising the steps of: forming a nickel-plated layer; forming an iron-plated layer on the nickel-plated layer; forming a multilayer-plated plate in which the nickel-plated layer and the iron-plated (Continued)

layer are alternately and repeatedly arranged; and heat-treating the multilayer-plated plate at a temperature of 300° C. or higher.

18 Claims, 7 Drawing Sheets

(51) Int. Cl.
    *B32B 15/01*     (2006.01)
    *C23C 14/04*     (2006.01)
    *C23F 1/02*     (2006.01)
    *C25D 5/50*     (2006.01)
    *C25D 5/12*     (2006.01)
    *C23C 14/12*     (2006.01)

(52) U.S. Cl.
    CPC ............... *C25D 5/12* (2013.01); *C25D 5/50* (2013.01); *C25D 7/0614* (2013.01); *C23C 14/12* (2013.01)

(56) References Cited

U.S. PATENT DOCUMENTS

2018/0065162 A1    3/2018    Mikami et al.
2018/0066352 A1    3/2018    Tamura et al.
2019/0010623 A1    1/2019    Kim et al.

FOREIGN PATENT DOCUMENTS

| CN | 106460149 A | 2/2017 |
|---|---|---|
| CN | 106460150 A | 2/2017 |
| JP | 2005-154879 A | 6/2005 |
| JP | 2015-36436 A | 2/2015 |
| JP | 2015-168884 A | 9/2015 |
| JP | 2017-43848 A | 3/2017 |
| KR | 10-0778540 B1 | 11/2007 |
| KR | 10-2008-0064720 A | 7/2008 |
| KR | 10-1693514 B1 | 1/2017 |
| WO | WO 2016/129534 A1 | 8/2016 |
| WO | WO 2017/014016 A1 | 1/2017 |

OTHER PUBLICATIONS

International Search Report for PCT/KR2018/002742 dated Jul. 18, 2018.

* cited by examiner

[Fig. 1]
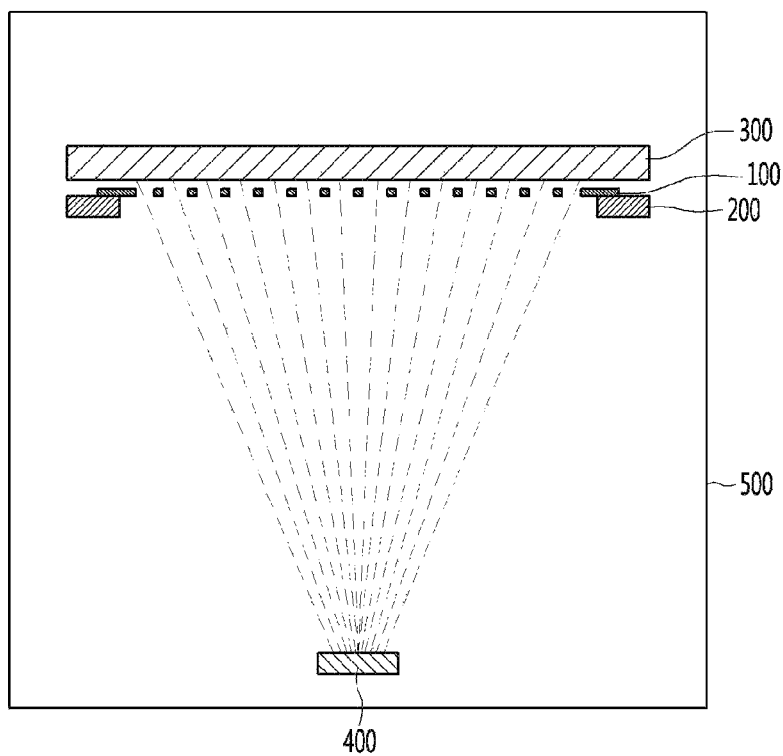

[Fig. 2]
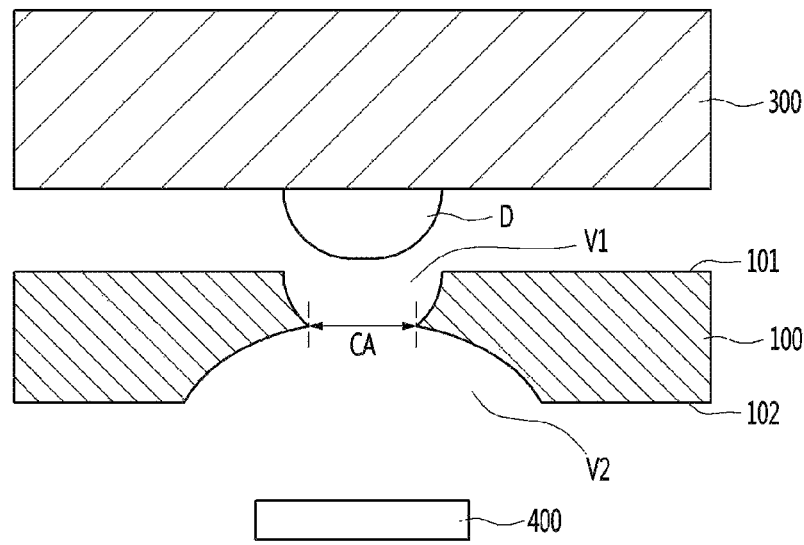
[Fig. 3]
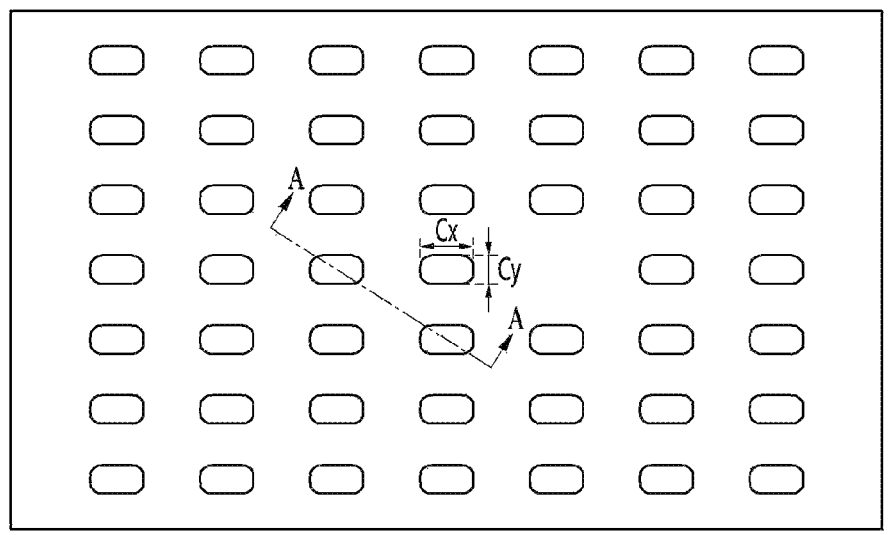

[Fig. 4]
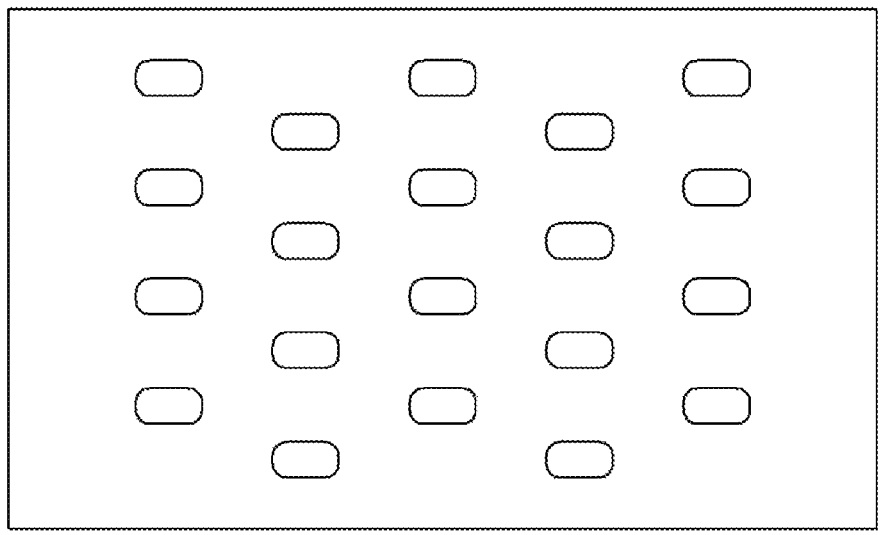
[Fig. 5]
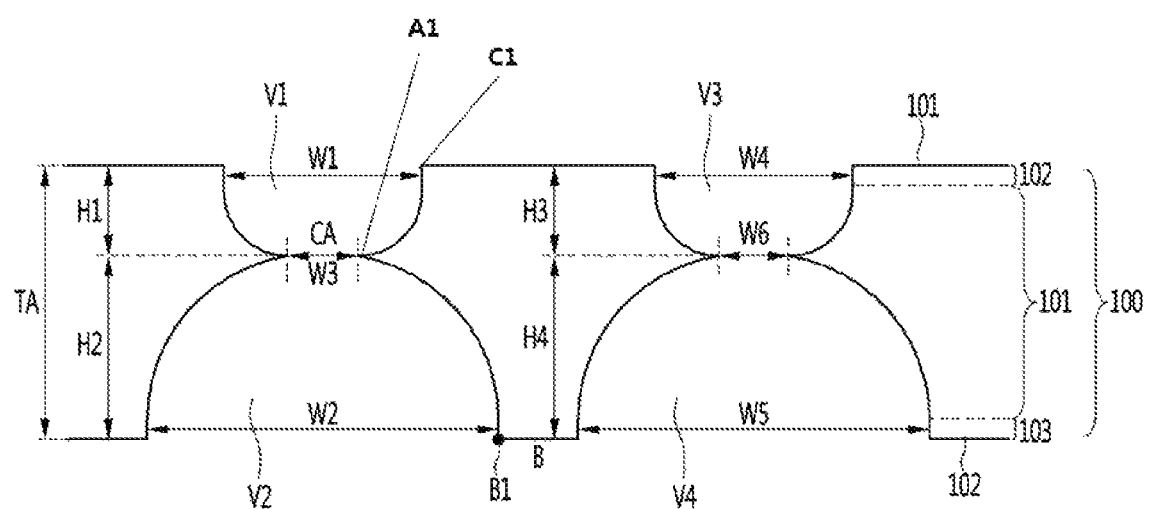
[Fig. 6]
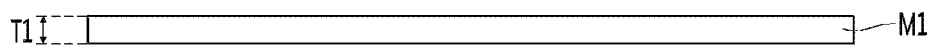

[Fig. 7]
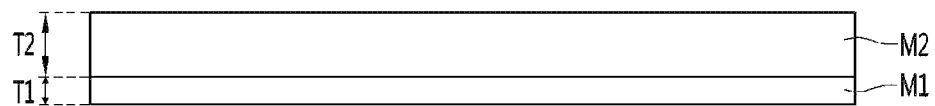
[Fig. 8]
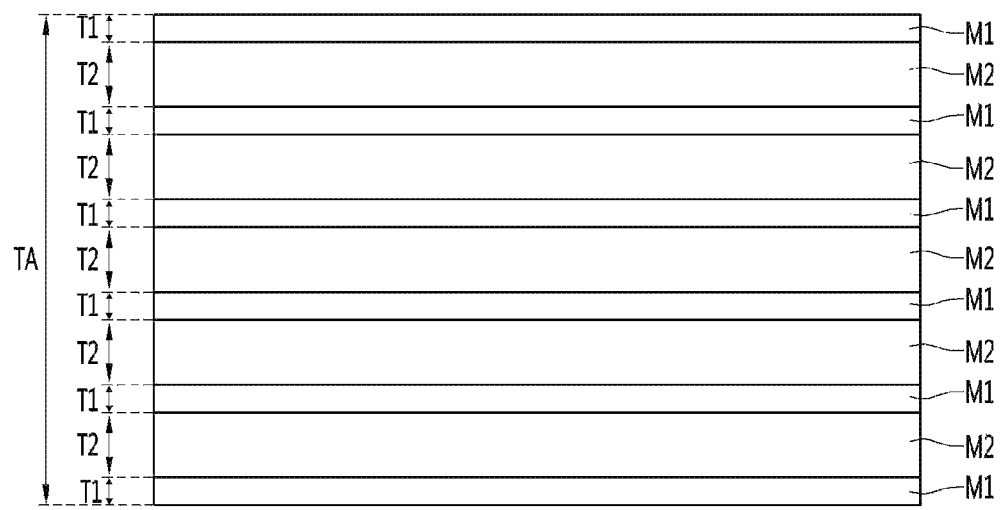
[Fig. 9]
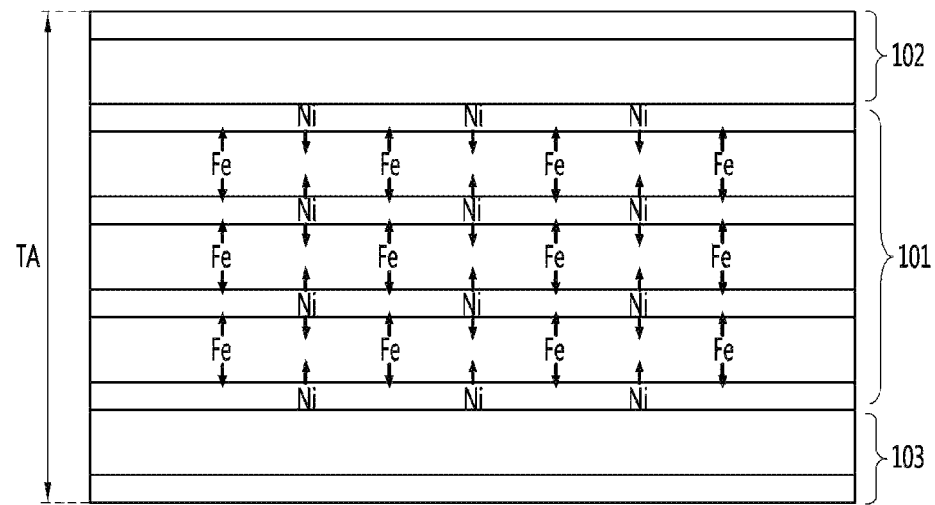

【Fig. 10】
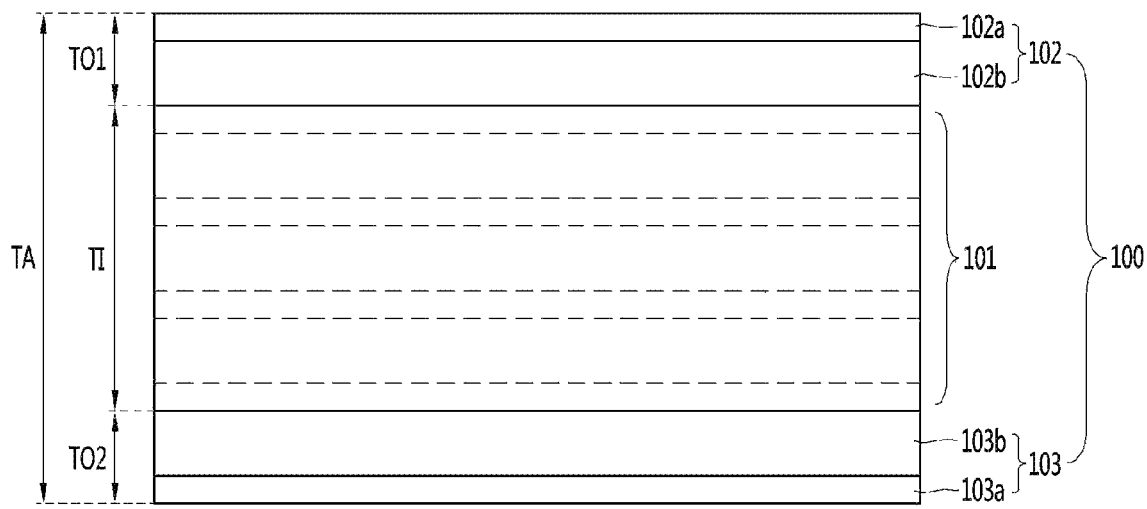
【Fig. 11】
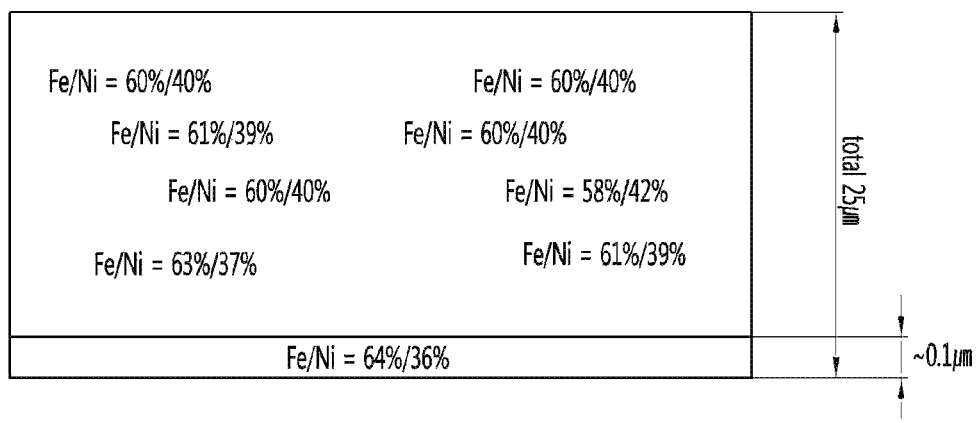

[Fig. 12]
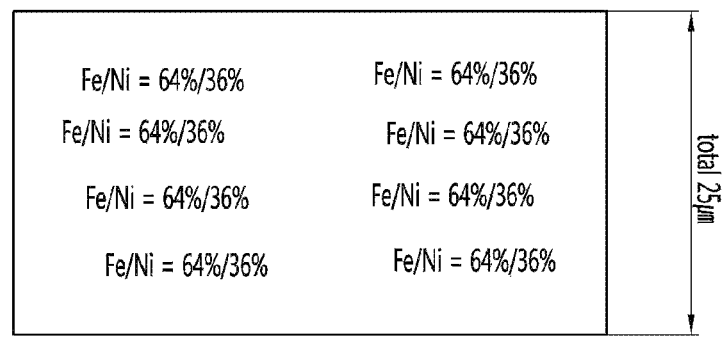
[Fig. 13]
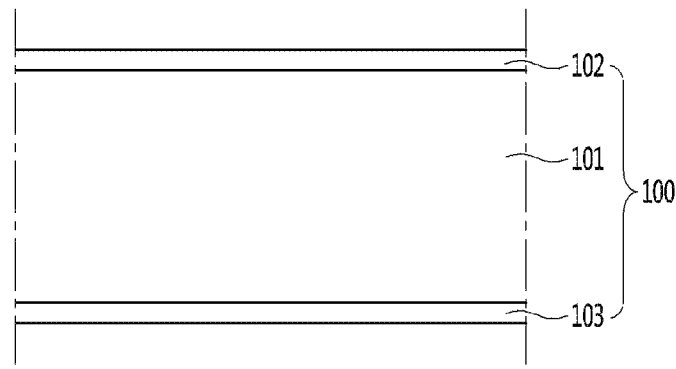
[Fig. 14]
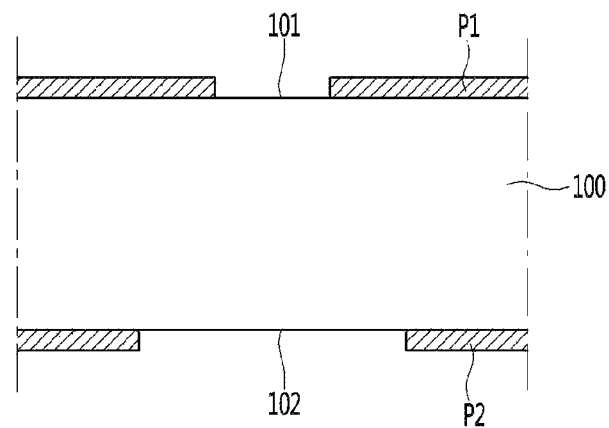

[Fig. 15]
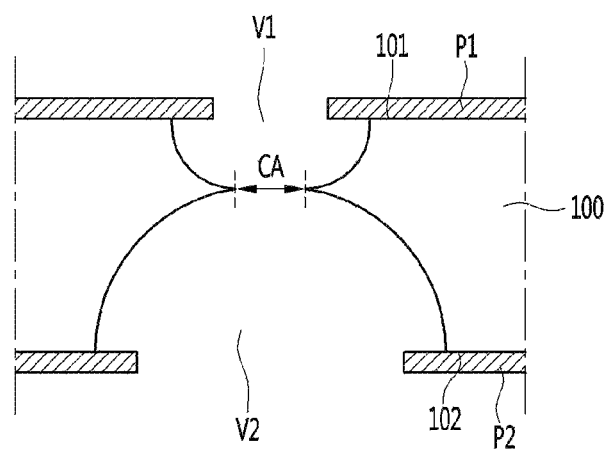
[Fig. 16]
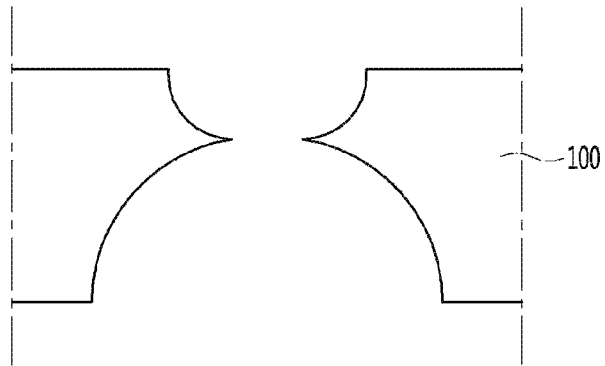

METAL PLATE, DEPOSITION MASK, AND MANUFACTURING METHOD THEREFOR

CROSS REFERENCE TO RELATED APPLICATIONS

This application is the National Phase of PCT International Application No. PCT/KR2018/002742, filed on Mar. 8, 2018, which claims priority under 35 U.S.C. 119(a) to Patent Application No. 10-2017-0031938, filed in the Republic of Korea on Mar. 14, 2017, all of which are hereby expressly incorporated by reference into the present application.

TECHNICAL FIELD

An embodiment relates to a metal plate. Specifically, an embodiment relates to a metal plate capable of being used for a mask for deposition. More specifically, an organic light emitting diode (OLED) panel may be manufactured by using the mask for deposition according to an embodiment.

BACKGROUND ART

As a display device having high resolution and low power consumption is required, various display devices such as a liquid crystal display device and an electroluminescent display device have been developed.

The electroluminescent display device has been spotlighted as a next generation display device due to excellent characteristics such as low light emission, low power consumption, and high resolution, and the like, as compared with the liquid crystal display device.

There are an organic light emitting display device and an inorganic light emitting display device in an electric field display device. That is, an electric field display device may be classified into the organic light emitting display device and the inorganic light emitting display device according to a material of a light emitting layer.

Of these, the organic light emitting display device has received attention because the organic light emitting display device has a wide viewing angle, has a fast response speed, and is required to have low power consumption.

An organic material constituting such a light emitting layer may be formed to have a pattern for forming a pixel on a substrate by a fine metal mask method.

At this point, the fine metal mask, that is, a mask for deposition may have a through-hole corresponding to the pattern to be formed on the substrate, and, patterns of red (R), green (G), and blue (B) forming a pixel may be formed by depositing the organic material after the fine metal mask is aligned on the substrate.

In order to form a deposition pattern having high resolution to ultra-high resolution pixels, a thin metal plate is required.

In order to thin a metal plate, rolling or plating methods may be tried.

A rolled metal plate has a problem that it is difficult to be manufactured with a thin thickness. In case of manufacturing the rolled metal plate at 20 µm or less, there is a problem that it is difficult to form through-holes of uniform size as quality of a product is lowered.

On the other hand, although a metal plate formed by plating may have a thin thickness, when a metal plate is made of an alloy, there is a problem that it is difficult to control the composition thereof. A metal plate formed with a sub-micro unit thickness on an initial plating layer having a constant alloy ratio may have the same alloy ratio as the initial plating layer, but a micro unit thickness metal plate has a difficult problem of having the same alloy ratio as the initial plating layer. Accordingly, the plated metal plate having a thickness of 1 µm or more has a problem that the quality of the product is lowered due to an increase in thermal expansion coefficient.

Therefore, a metal plate for a deposition mask having a new structure, a deposition mask, and a method of manufacturing thereof are required.

DISCLOSURE

Technical Problem

An embodiment is directed to providing a metal plate capable of ensuring uniformity of an alloy composition while having a small thickness. In addition, an embodiment is directed to providing a metal plate capable of forming uniform through-holes.

Technical Solution

In a metal plate used for manufacturing a mask for deposition according to an embodiment, a multi-layered metal plate has a thickness of 30 µm or less and includes an alloy of nickel (Ni) and iron (Fe), a first outer portion occupying a region of 20% or less of the total thickness from one surface of the metal plate, a second outer portion occupying a region of 20% or less of the total thickness from the other surface opposite to the one surface, and a central portion other than the first outer portion and the second outer portion, wherein nickel contents of the first outer portion and the second outer portion are greater than that of the central portion.

In a metal plate used for manufacturing a mask for deposition according to an embodiment, a multi-layered metal plate including an alloy of nickel (Ni) and iron (Fe) includes: forming a nickel plating layer; forming an iron plating layer on the nickel plating layer; forming a multi-layered plating plate by alternately repeating the nickel plating layer and the iron plating layer to be disposed thereon; and heat-treating the multi-layered plating plate at a temperature of 300° C. or higher.

Advantageous Effects

A multi-layered metal plate according to an embodiment has a thickness of 30 µm or less, includes an alloy of nickel (Ni) and iron (Fe), and includes an outer portion occupying a region of 20% or less of the total thickness and a central portion other than the outer portion, and a nickel content of the outer portion may be greater than that of the central portion. Accordingly, in the multi-layered metal plate according to the embodiment, an etch rate on a surface in which the outer portion is position may be delayed, thereby improving an etching factor.

The multi-layered metal plate including an alloy of nickel (Ni) and iron (Fe) according to the embodiment may formed by plating. Accordingly, the multi-layered metal plate according to the embodiment may be formed with a thin thickness of 30 µm or less.

A manufacturing method of the multi-layered metal plate according to the embodiment may include: forming a nickel plating layer; forming an iron plating layer on the nickel plating layer; forming a multi-layered plating plate by alternately repeating the nickel plating layer and the iron plating layer to be disposed thereon; and heat-treating the multi-layered plating plate at a temperature of 300° C. or higher.

That is, the metal plate according to the embodiment may be formed as a multi-layered metal plate by heat treatment after being formed such that the nickel plating layer and the iron plating layer are alternately disposed. In addition, iron in the iron plating layer and nickel in the nickel plating layer may be diffused respectively by heat treatment at a temperature of 300° C. or higher, thereby having a uniform content in a predetermined thickness range. Accordingly, the metal plate according to the embodiment may have a low thermal expansion coefficient, and a mask for deposition using the same may include uniform through-holes.

DESCRIPTION OF DRAWINGS

FIGS. 1 and 2 are conceptual diagrams illustrating a process of depositing an organic material on a substrate.

FIGS. 3 and 4 are views illustrating a front view of a multi-layered metal plate.

FIG. 5 is a view of an embodiment illustrating a cross-sectional view taken along line A-A' in FIG. 3.

FIGS. 6 to 10 are views illustrating a manufacturing process of a multi-layered metal plate according to an embodiment.

FIG. 11 is a view illustrating a composition ratio distribution of dissimilar alloys according to a thickness of a metal plate formed by plating according to a comparative example.

FIG. 12 is a view illustrating a composition ratio distribution of a dissimilar alloy according to a thickness of a metal plate heat-treated after multi-step plating according to an embodiment.

FIGS. 13 to 16 are views illustrating a manufacturing process of through-holes of a mask for deposition according to an embodiment.

MODES OF THE INVENTION

Hereinafter, embodiments will be described in detail with reference to the accompanying drawings.

In describing with reference to the accompanying drawings, like drawing numerals are used to designate identical elements, and redundant description thereof will be omitted.

Although terms such as "first", "second", etc. can be used to describe elements, the above-described elements should not be limited by the above terms, and are only used to distinguish one element from another.

Also, when a part is referred to as "including" an element, it means that the part may include other elements as well without excluding the other elements unless specifically stated otherwise.

In the drawings, the thickness or the size of each layer (film), region, pattern or structure may be modified for clarity and convenience of explanation, and thus does not entirely reflect the actual size. In the description of the embodiments, in the case in which each layer (film), region pattern or structure is described as being formed "over", "on" or "under" a substrate, each layer (film), area, pad or pattern, the "over", "on" and "under" include both of forming "directly" and "indirectly". Each embodiment may be implemented independently or together, and some elements may be excluded in order to meet objectives of the invention. Hereinafter, embodiments will be described with reference to the accompanying drawings.

A process for depositing an organic material on a substrate will be described with reference to FIGS. 1 and 2.

FIG. 1 is a view illustrating an organic material deposition apparatus in which a metal plate 100 according to an embodiment is included as a mask for deposition.

The organic material deposition apparatus may include a metal plate 100 used as a mask for deposition, a mask frame 200, a substrate 300, an organic material deposition container 400, and a vacuum chamber 500.

The mask for deposition may be a metal plate 100 according to an embodiment. The metal plate 100 may include a plurality of through-holes. At this point, the through-holes may be formed to correspond to patterns to be formed on the substrate.

The mask frame 200 may include an opening. The plurality of through-holes of the metal plate 100 may be disposed on a region corresponding to the opening. Accordingly, organic material supplied to the organic material deposition container 400 may be deposited on the substrate 300.

The mask for deposition may be disposed and fixed on the mask frame 200. For example, the mask for deposition may be tensioned and fixed on the mask frame 200 by welding.

The substrate 300 may be a substrate used for manufacturing a display device. Patterns of red (R), green (G), and blue (B) may be formed on the substrate 300 to form a pixel that is three primary colors of light.

The organic material deposition container 400 may be a crucible. An organic material may be disposed at an inside of the crucible.

As a heat source and/or current is supplied to the crucible in the vacuum chamber 500, the organic material may be deposited on the substrate 300.

FIG. 2 is an enlarged view of one through-hole of the metal plate 100.

The metal plate 100 may include a first surface 101 and a second surface 102 facing the first surface.

The first surface 101 of the metal plate 100 may include a first surface hole V1 and the second surface 102 of the metal plate 100 may include a second surface hole V2.

The through-hole may be formed by a connecting part CA through which the first surface hole V1 and the second surface hole V2 communicate with each other.

A width of the second surface hole V2 may be greater than that of the first surface hole V1. At this point, the width of the first surface hole V1 may be measured at the first surface 101, and the width of the second surface hole V2 may be measured at the second surface 102.

The first surface hole V1 may be disposed toward the substrate 300. Accordingly, the first surface hole V1 may have a shape corresponding to a deposition material D, that is, a pattern.

The second surface hole V2 may be disposed toward the organic material deposition container 400. Accordingly, the second surface hole V2 may accommodate the organic material supplied from the organic material deposition container 400 in a wide width, and a fine pattern may be formed quickly on the substrate 300 through the first surface hole V1 having a width smaller than that of the second surface hole V2.

FIGS. 3 and 4 are views illustrating a front view of a metal plate 100.

The metal plate 100 may include a plurality of through-holes. The plurality of through-holes shown in FIG. 3 may represent the second surface hole V2. When a diameter Cx in a horizontal direction and diameter Cy in a vertical direction of a reference hole, which is any one of the through-holes, are measured, deviation of the diameter Cx in the horizontal direction and the diameter Cy in the vertical direction between holes (six holes in total as shown in the drawing) adjacent to the reference hole may be implemented at 2% to 10%, respectively. That is, when a size deviation between adjacent holes of one reference hole is implemented at 2% to 10%, uniformity of the deposition may be ensured.

For example, the size deviation between the reference hole and the adjacent holes may be 4% to 9%. For example, the size deviation between the reference hole and the adjacent holes may be 5% to 7%.

When the size deviation between the reference hole and the adjacent holes is less than 2%, an occurrence rate of moire in an OLED panel after deposition may be increased. When the size deviation between the reference hole and the adjacent holes is more than 10%, an occurrence rate of color stain in the OLED panel after deposition may be increased.

An embodiment may be implemented at a size deviation within ±3 μm between the reference hole and the adjacent holes. Accordingly, deposition efficiency may be improved.

For example, referring to FIG. 3, the through-holes may be disposed in a row in a vertical axis and in a row in a horizontal axis.

For example, referring to FIG. 4, the through-holes may be disposed in a row in the vertical axis and may be disposed to be staggered from each other in the horizontal axis.

The through-hole may have a first diameter measured in the vertical direction and a second diameter measured in the horizontal direction, which may correspond to each other or may be different from each other. The through-hole may have a third diameter measured in a first diagonal direction corresponding to a cross-sectional direction of A-A' and a fourth diameter measured in a second diagonal direction intersecting the first diagonal direction, which may be correspond to each other or may be different from each other. The through-hole may be rounded.

FIG. 5 is an enlarged view of a cross section of a plurality of through-holes in a mask for deposition according to an embodiment.

Referring to FIG. 5, the metal plate 100 used for manufacturing a mask for deposition may include a central portion 101 and outer portions 102 and 103.

The outer portions 102 and 103 may be located in a region of 20% or less of the total thickness. The outer portions 102 and 103 may be formed on one surface or both surfaces of the surface of the metal plate 100. For example, the first outer portion 102 may be included on one surface of the metal plate 100 and the second outer portion 103 may be included on the other surface opposite to the one surface of the metal plate 100.

The central portion 101 may refer to a metal plate portion other than the outer portions. For example, the central portion 101 may be a region of a metal plate other than the first outer portion 102 and the second outer portion 103. In detail, the central portion 101 may be located at a central portion between the first outer portion 102 and the second outer portion 103.

A total thickness TA of the metal plate 100 may be 30 μm or less. For example, the total thickness TA of the metal plate 100 may be 25 μm or less. For example, the total thickness TA of the metal plate 100 may be 1 μm to 20 μm or less.

The metal plate 100 may be formed by a process other than rolling, and even when the metal plate 100 has a thickness of 20 μm or less, a manufacturing yield may be excellent.

A multi-layered metal plate according to an embodiment may include a plurality of plating layers. Accordingly, the metal plate 100 may have a uniform content of nickel and iron even when the metal plate 100 is formed by plating to a thickness of 1 μm or more.

The total thickness of at least one of the first outer portion 102 and the second outer portion 103 may be 5 μm or less. In detail, the first outer portion 102 may be defined as a thickness range of 5 μm or less from one surface of the metal plate, and the second outer portion 103 may be defined as a thickness range of 5 μm or less from the other surface of the metal plate. For example, the total thickness of at least one of the first outer portion 102 and the second outer portion 103 may be 0 μm to 3 μm or less.

The thicknesses of the first outer portion 102 and the second outer portion 103 may correspond to each other. Here, the "corresponding" may be the same or may include an error due to tolerance.

A thickness of the central portion 101 may be greater than that of the outer portions 102 and 103. The thickness of the central portion 101 may be greater than that of any outer portion of the first outer portion 102 and the second outer portion 103. The thickness of the central portion 101 may be greater than that of the first outer portion 102 and the second outer portion 103.

The metal plate 100 may include an alloy of nickel (Ni) and iron (Fe). The central portion 101 and the outer portions 102 and 103 may include the alloy of nickel (Ni) and iron (Fe).

A content of nickel in the outer portions 102 and 103 may be different from a content of nickel in the central portion 101. The content of nickel in the outer portions 102 and 103 may be larger than that of nickel in the central portion 101. Accordingly, a surface of the metal plate on which the outer portion is located may have an etch rate lower than that of the central portion to form through-holes. Accordingly, the multi-layered metal plate of the embodiment may improve an etching factor and may uniformly form the through-holes of a fine size.

Meanwhile, an iron content of the outer portions 102 and 103 may be different from that of the central portion 101. The iron content of the outer portions 102 and 103 may be smaller than that of the central portion 101.

The content of nickel in the outer portions 102 and 103 may be 36 wt % to 100 wt %. For example, the content of nickel in the outer portions 102 and 103 may be 40 wt % to 100 wt %. For example, the nickel content of the outer portions 102 and 103 may be 50 wt % to 100 wt %.

The central portion 101 may be a binary alloy having a predetermined content. The central portion 101 may be invar including about 36 wt % of nickel and about 64 wt % of iron. Here, "36 wt %" and "64 wt %" may each include an error range of ±0.1%, or an error range of ±0.01%. An invar-based metal plate may have a low thermal expansion coefficient. Such an invar characteristic may improve manufacturing efficiency and the manufacturing yield of the mask for deposition.

The central portion 101 may have a uniform composition regardless of a measurement position or a measurement thickness.

For example, in the central portion 101, a content measured at any first point may be 36 wt % of nickel and 64 wt % of iron, and a content measured at any second point other than the first point may be 36 wt % of nickel and 64 wt % of iron.

For example, in the central portion 101, a content measured at any first thickness may be 36 wt % of nickel and 64 wt % of iron, and a content measured at any second thickness other than the first thickness may be 36 wt % of nickel and 64 wt % of iron.

The central portion 101 of the multi-layered metal plate according to the embodiment may have a characteristic of low thermal expansion coefficient of invar. Accordingly, in the multi-layered metal plate according to the embodiment, the manufacturing efficiency of the mask for deposition including a plurality of fine through-holes having a uniform size may be excellent.

The component, the content, and the weight % of the metal plate 100 may be confirmed using a method of examining the wt % of each component by selecting a specific region a*b on a plane of the metal plate 100, sampling a test piece (a*b*t) corresponding to the thickness t of the metal plate 100, and dissolving it in a strong acid, etc. However, the embodiment is not limited thereto, and the content may be confirmed by various methods.

The metal plate 100 may have different widths of through-holes along the thickness direction of the through-hole. For example, a width W1 of the first surface hole V1 may be greater than a width W3 of the connecting part CA. Specifically, the width of the through-hole may be reduced as the first surface hole V1 goes from the first surface 101 toward the connecting part CA. More specifically, the width of the through-hole may be gradually reduced as the first surface hole V1 goes from the first surface 101 toward the connecting part CA.

For example, a width W2 of the second surface hole V2 may be greater than the width W3 of the connecting part CA. Specifically, the width of the through-hole may be reduced as the second surface hole V2 goes from the second surface 102 toward the connecting part CA. More specifically, the width of the through-hole may be gradually reduced as the second surface hole V2 goes from the second surface 102 toward the connecting part CA.

The deposition mask according to the embodiment may include a plurality of through holes. In this case, a width of one through hole may be 40 μm or less. For example, the width of the through hole may be 5 μm to 40 μm. For example, the width of the through hole may be 10 μm to 35 μm. For example, at least one of the width W1 of the first surface hole and the width W2 of the second surface hole may have a width of 40 μm or less. When the width of the through hole exceeds 40 μm, it may be difficult to form a fine deposition pattern.

A height H2 of the second surface hole V2 may be greater than a height H1 of the first surface hole V1.

Meanwhile, the height H1 of the first surface hole V1 may have a ratio of 1:3 to 30 to the thickness T of the metal plate 100. For example, the height H1 of the first surface hole V1 may have a ratio of 1:3.5 to 12.5 with respect to the thickness T of the metal plate 100. For example, the height H1 of the first surface hole V1 may have a ratio of 1:4.5 to 10.5 in relation to the thickness T of the metal plate 100.

When the height H1 of the first surface hole V1 is more than the ratio in relation to the thickness T of the metal plate 100, the height H1 of the first surface hole V1 is increased and the thickness variation of an organic material is increased and thus, a region in which an organic material is not deposited may occur. Accordingly, a manufacturing yield of the OLED panel manufactured through the mask for deposition may be reduced.

The height H1 of the first surface hole V1 may be 0.1 to 7 μm. For example, the height H1 of the first surface hole V1 may be 1 to 6 μm. For example, the height H1 of the first surface hole V1 may be 2 to 4.5 μm. When the height H1 of the first surface hole V1 is less than 0.1 μm, deposition efficiency of the organic material via the metal plate may be reduced. When the height H1 of the first surface hole V1 is more than 7 μm, it is difficult to form a pattern of a fine size and a region in which an organic material is not deposited may occur, and thus the yield of the OLED panel manufactured through the same may be deteriorated.

Meanwhile, since a third surface hole V3 adjacent to the first surface hole V1 and formed on the first surface 101 communicates with a fourth surface hole V4 adjacent to the second surface hole V2 and formed on the second surface 102, through the connecting part CA respectively, a plurality of through-holes may be formed.

A substrate for a deposition mask according to an embodiment may include bridge regions between an arbitrary first through-hole and a second through-hole adjacent to the first through-hole. For example, the first surface 101 between the first surface hole V1 and the third surface hole V3 may include a first bridge region, and the second surface 102 between the second surface hole V2 and the fourth surface hole V4 may include a second bridge region The first bridge region may be larger than a planar area of the second bridge region. The bridge region may support the plurality of through holes so as to be spaced apart at a predetermined distance.

An inclination angle connecting an arbitrary point A1 of an end of the connecting part CA to an arbitrary point B1 of an end of the second surface hole V2 may be in the range of 20 to 70 degrees. For example, the inclination angle connecting an arbitrary point A1 of an end of the connecting part CA to an arbitrary point B1 of an end of the second surface hole V2 may be in the range of 30 to 60 degrees. For example, the inclination angle connecting an arbitrary point A1 of an end of the connecting part CA to an arbitrary point B1 of an end of the second surface hole V2 may be in the range of 32 to 38 degrees or 52 to 58 degrees. When the inclination angle connecting an arbitrary point A1 of an end of the connecting part CA to an arbitrary point B1 of an end of the second surface hole V2 is in the range of 20 to 70 degrees, uniformity of the deposition may be improved. When the inclination angle is out of the range, a region in which an organic material is not deposited may occur, and thus deposition efficiency and process efficiency may be deteriorated.

The width of the through-hole may become narrower as the first surface hole V1 goes toward a center of the metal plate 100. For example, an inner surface of the first surface hole V1 may be a structure having curvature. In addition, the width of the through-hole may become narrower as the second surface hole V2 goes toward the center of the metal plate 100. For example, the inner surface of the first surface hole V1 may be a structure having curvature. Accordingly, an introduction density of the deposition material may be controlled, and uniformity of the deposition may be improved as compared with a simple slope structure.

A difference W1–W3 between the width W1 of the first surface hole V1 and the width W3 of the connecting part CA may be in the range of 0.2 to 14 μm.

A vertical distance from an arbitrary point C1 at an end of the first surface hole V1 to an arbitrary point A1 at an end of the connecting part CA may be in the range of 0.1 to 7 μm. The vertical distance from an arbitrary point C1 at an end of the first surface hole V1 to an arbitrary point A1 at an end of the connecting part CA may be in the range of 1 to 6 μm. The vertical distance from an arbitrary point C1 at an end of the first surface hole V1 to an arbitrary point A1 at an end of the connecting part CA may be in the range of 2 to 4.5 μm.

When the vertical distance is less than 0.1 μm, deposition efficiency of the organic material via the metal plate 100 may be reduced. When the vertical distance is more than 7 μm, it is difficult to form a pattern of a fine size and a region in which an organic material is not deposited may occur, and thus the yield of the OLED panel manufactured through the same may be deteriorated.

The first surface hole V1 may have a curvature at an edge portion of an open region on the first surface 101, that is, an outer portion of an open region. Alternatively, the second surface hole V2 may have a curvature at an edge portion of an open region on the second surface 102, that is, an outer portion of an open region. For example, the edge portion of the open region may be a rounded structure having curvature of a predetermined range. A diameter of a virtual circle formed by extending the curvature of the rounded portion of the edge portion may be in the range of 5 to 20 μm. For example, the diameter of a virtual circle formed by extending the curvature of the rounded portion of the edge portion may be in the range of 7 to 15 μm. The diameter of a virtual circle formed by extending the curvature of the rounded portion of the edge portion may be in the range of 8 to 12 μm. In the range, the deposition rate is high and an organic material may be deposited uniformly.

When the diameter of a virtual circle formed by extending the curvature of the rounded portion of the edge portion is less than 5 μm, difference in the deposition rate from the case in which curvature treatment is not performed may not be large. When the diameter of a virtual circle formed by extending the curvature of the rounded portion of the edge portion is more than 20 μm, the deposition rate may be deteriorated.

A width W5 of the fourth surface hole V4 may be greater than a width W4 of the third surface hole V3. For example, the width W4 of the third surface hole V3 may be greater than a width W6 of the connecting part CA. Specifically, the width of the through-hole may be reduced as the third surface hole V3 goes from the first surface 101 toward the connecting part CA. Specifically, the width of the through-hole may be gradually reduced as the third surface hole V3 goes from the first surface 101 toward the connecting part CA.

For example, the width W5 of the fourth surface hole V4 may be greater than the width W6 of the connecting part CA. Specifically, the width of the through-hole may be reduced as the fourth surface hole V4 goes from the second surface 102 toward the connecting part CA. Specifically, the width of the through-hole may be gradually reduced as the fourth surface hole V4 goes from the second surface 102 toward the connecting part CA.

A height H4 of the fourth surface hole V4 may be greater than a height H3 of the third surface hole V3.

FIGS. 6 to 10 are views illustrating a manufacturing process of a multi-layered metal plate according to an embodiment.

In a metal plate used for manufacturing a mask for deposition according to an embodiment, a multi-layered metal plate including an alloy of nickel (Ni) and iron (Fe) may be manufactured by including: forming a nickel plating layer; forming an iron plating layer on the nickel plating layer; forming a multi-layered plating plate by alternately repeating the nickel plating layer and the iron plating layer to be disposed thereon; and heat-treating the multi-layered plating plate at a temperature of 300° C. or higher. Here, the nickel plating layer forming step and the iron plating layer forming step are not limited to a case in which the nickel plating layer is formed first, and it goes without saying that the iron plating layer may be formed first. That is, in a metal plate used for manufacturing a mask for deposition according to an embodiment, the multi-layered metal plate including an alloy of nickel (Ni) and iron (Fe) may be manufactured by including: forming an iron plating layer; forming a nickel plating layer on the iron plating layer; forming a multi-layered plating plate by alternately repeating the iron plating layer and the nickel plating layer to be disposed thereon; and heat-treating the multi-layered plating plate at a temperature of 300° C. or higher.

First, the forming of the nickel plating layer will be described with reference to FIG. 6.

Referring to FIG. 6, the nickel plating layer M1 may include about 100 wt % of nickel. The forming of the nickel plating layer is a step of plating the nickel plating layer M1 to a proper thickness that may include a content of about 100 wt % of a predetermined nickel. Here, "100 wt %" may refer to 99.9% to 100%, or 99.99% to 100%, and may refer to a case in which impurities less than 0.1% is included by an external environment, or impurities less than 0.01% is included by a tolerance.

The nickel plating layer M1 may have a first thickness T1. For example, the first thickness T1 of the nickel plating layer M1 may be 2 μm or less. For example, the first thickness T1 of the nickel plating layer M1 may be 1 μm or less.

The nickel plating layer M1 may be formed up to the first thickness T1 by passing through a nickel plating bath filled with a nickel plating solution for forming a plating layer having a content of about 100% of nickel.

Next, the forming of the iron plating layer will be described with reference to FIG. 7.

An iron plating layer M2 may be formed on the nickel plating layer M1 previously formed. The iron plating layer M2 may include about 100 wt % of iron. The forming of the iron plating layer is a step of plating the iron plating layer M2 to a proper thickness that may include a content of about 100 wt % of a predetermined iron. Here, "100 wt %" may refer to 99.9% to 100%, or 99.99% to 100%, and may refer to a case in which impurities less than 0.1% is included by an external environment, or impurities less than 0.01% is included by a tolerance.

The iron plating layer M2 may have a second thickness T2. For example, the second thickness T2 of the iron plating layer M2 may be 2 μm or less. For example, the second thickness T2 of the iron plating layer M2 may be 1 μm or less.

The iron plating layer M2 may be formed up to the second thickness T2 by passing through an iron plating bath filled with an iron plating solution for forming a plating layer having a content of about 100% of iron.

At this time, the first thickness T1 of the nickel plating layer M1 may be different from the second thickness T2 of the iron plating layer M2. The first thickness T1 of the nickel plating layer M1 may be smaller than the second thickness T2 of the iron plating layer M2. In detail, a ratio of the first thickness T1 of the nickel plating layer M1 to the second thickness T2 of the iron plating layer M2 may be 36:64.

That is, a ratio of weight % of nickel to weight % of iron included in a central portion is the same as the ratio of the first thickness T1 of the nickel plating layer M1 to the second thickness T2 of the iron plating layer M2.

For example, when a sum of the first thickness T1 of the nickel plating layer M1 and the second thickness T2 of the iron plating layer M2 is 1 μm, the second thickness T2 of the iron plating layer M2 may be 0.64 μm, and the first thickness T1 of the nickel plating layer M1 may be 0.36 μm. A thickness of an embodiment is not limited thereto, and it goes without saying that the thickness may be various thicknesses within a range in which the first thickness T1 of the nickel plating layer M1 and the second thickness T2 of the iron plating layer M2 satisfy the ratio of 36:64.

Next, the forming of the multi-layered plating plate by alternately repeating the nickel plating layer and the iron plating layer to be disposed thereon will be described with reference to FIG. 8.

The nickel plating layer M1 may be disposed on the iron plating layer M2 formed previously, and the iron plating layer M2 may be formed on the nickel plating layer M1 again.

That is, the nickel plating layer M1 having the first thickness T1 and the iron plating layer M2 having the second thickness T2 may be disposed by alternately repeating. Each of the nickel plating layers M1 in the multi-layered plating plate may have the first thickness T1 uniform from each other. In addition, each of the iron plating layers M2 in the multi-layered plating plate may have the second thickness T2 uniform from each other.

The nickel plating layer M1 may be formed by a roll-to-roll process continuously passing through a plating bath different from the iron plating layer M2 each other. That is, after forming the nickel plating layer by passing through a nickel plating solution, the iron plating layer may be formed by passing through an iron plating solution, and the nickel plating layer may be formed on the iron plating layer by passing through the nickel plating solution again.

That is, the multi-layered metal plate may be formed by alternately and continuously passing through a nickel plating bath in which a nickel plating solution of a first composition is contained and an iron plating bath in which an iron plating solution of a second composition different from the first composition is contained.

At this time, in order to avoid a problem that the nickel plating solution remaining after forming the nickel plating layer causes a change in a composition of the iron plating solution, or the iron plating solution remaining after forming the iron plating layer causes a change in a composition of the nickel plating solution, a water washing and drying process may be required between the forming of the nickel plating layer M1 and the forming of the iron plating layer M2.

For example, the forming of the multi-layered plating plate may include a continuous process of forming the nickel plating layer passing through the nickel plating bath, water washing for cleaning the nickel plating solution, liquid draining for removing water on the nickel plating layer, and forming the iron plating layer passing through the iron plating bath.

The water washing after the forming of the nickel plating layer is a step for cleaning the nickel plating solution. The liquid draining after the cleaning of the nickel plating solution is a step of drying moisture in order to prevent concentration of the iron plating solution passing later from changing due to moisture remaining on the nickel plating layer. Accordingly, the iron plating layer formed after the step of liquid draining may have a content of 100 wt % of iron (Fe).

Next, the water washing after the forming of the iron plating layer is a step for cleaning the iron plating solution. The liquid draining after cleaning the iron plating solution is a step of drying moisture in order to prevent concentration of the nickel plating solution passing later from changing due to moisture remaining on the iron plating layer. Accordingly, the nickel plating layer formed after the step of liquid draining may have a content of 100 wt % of nickel (Ni).

The multi-layered plating plate may include the multi-layered nickel plating layer M1 and the multi-layered iron plating layer M2 alternately disposed with each other. At this time, the total thickness TA of the multi-layered plating plate may be the sum of the total thickness of the multi-layered nickel plating layer M1 and the total thickness of the multi-layered iron plating layer M2.

The total thickness TA of the multi-layered plating plate may be 30 µm or less. For example, the total thickness TA of the multi-layered plating plate may be 25 µm or less. For example, the total thickness TA of the multi-layered plating plate may be 20 µm or less.

The multi-layered plating plate may include two or more alloy layers of nickel (Ni) and iron (Fe), and a thickness of one alloy layer may be 2 µm or less. For example, a thickness of an alloy layer of the nickel plating layer M1 and the iron plating layer M2 included in the multi-layered plating plate may be 2 µm or less. For example, the thickness of any alloy layer of the nickel plating layer M1 and the iron plating layer M2 included in the multi-layered plating plate may be 1 µm or less. For example, the thickness of any alloy layer of the nickel plating layer M1 and the iron plating layer M2 included in the multi-layered plating plate may be 0.7 µm or less. For example, the thickness of any alloy layer of the nickel plating layer M1 and the iron plating layer M2 included in the multi-layered plating plate may be 0.4 µm or less.

Relation between a number n of the iron plating layers M2 and a number of the nickel plating layers M1 included in the multi-layered plating plate may be n:n to n:(n+1).

For example, the number of the iron plating layers M2 included in the multi-layered plating plate may be the same as the number of the nickel plating layers M1. At this time, a surface hole or through-holes may be formed on one surface of the metal plate in which nickel is located in an outer region.

For example, the number of the nickel plating layers M1 included in the multi-layered plating plate may be one more than the number of the iron plating layers M2. Since nickel may be located on one surface and the other surface of the multi-layered metal plate, the surface hole or the through-holes may be formed in a fine and uniform size on both sides of the metal plate.

The relation between the number n of the iron plating layers M2 and the number of the nickel plating layers M1 in the central portion 101 may be n:n to n:(n+1).

Next, the heat treatment of the multi-layered plating plate will be described with reference to FIG. 9.

The multi-layered plating plate in which the nickel plating layer M1 of 100 wt % of nickel having a first thickness and the iron plating layer M2 of 100 wt % of iron having a second thickness described above are alternately disposed by plating may be heat-treated at a temperature of 300° C. or higher. For example, the multi-layered plating plate may be heat-treated at a temperature of 400° C. to 1425° C. For example, the multi-layered plating plate may be heat-treated at a temperature of 600° C. to 1425° C. A specific temperature of the heat treatment may be appropriately selected in consideration of process efficiency and a manufacturing yield within the above range. When the heat treatment temperature is less than 300° C., diffusion of nickel and iron may be deteriorated. Accordingly, it may have a problem that a content ratio of the alloy of nickel and iron is not constant, and a thermal expansion coefficient of invar may not have a small characteristic.

The central portion 101 may include the nickel plating layer M1 of 100 wt % of nickel having first thicknesses of a plurality of layers and the iron plating layer M2 of 100 wt % of iron having a second thickness.

Since the central portion 101 is heat-treated at a temperature of 300° C. or more, the alloy of nickel and iron may have a gamma (γ) shaped face centered cubic (FCC). At this time, nickel and iron may be diffused by the heat treatment, and a time of heat treatment may be advanced to a time when diffusion equilibrium of nickel and iron is reached. Specifically, as the temperature of heat treatment becomes higher, the time of heat treatment may become shorter. For example, the time of heat treatment may be several minutes to several hundred hours. For example, the time of heat treatment may be 1 hour to 80 hours.

Since the central portion 101 is heat-treated at a temperature of 300° C. or more, nickel of the nickel plating layer M1 may be diffused to the iron plating layer M2, and iron of the iron plating layer M2 may be diffused to the nickel plating layer M1.

The central portion of the multi-layered metal plate in which the nickel plating layer of 100 wt % of nickel and the iron plating layer M2 of 100 wt % of iron are disposed at a thickness ratio of 36:64 may be changed to invar of 36 wt % of nickel and 64 wt % of iron after the heat treatment.

That is, the multi-layered metal plate may be formed such that the central portion includes the invar of 36 wt % of nickel and 64 wt % of iron by diffusion equilibrium of iron and nickel by the heat treatment.

The metal plate may include a first outer portion 102 and a second outer portion 103 in a region other than the central portion.

A first outer portion 102 may be disposed on one surface of the metal plate, and a second outer portion 103 may be disposed on the other surface opposite to the one surface of the metal plate. The first and second outer portions 102 and 103 may include the nickel plating layer M1 of 100 wt % of nickel having a first thickness of one or more layers and the iron plating layer M2 of 100 wt % of iron having a second thickness of one or more layers. In detail, the relation between a number n of the iron plating layers M2 of the first outer portion 102 and the second outer portion 103 and the number of the nickel plating layers M1 may be n:n to n:(n+1).

A multi-layered metal plate of an embodiment formed after the heat treatment will be described with reference to FIG. 10.

The central portion 101 after the heat treatment may include invar having a predetermined content of 36 wt % of nickel and 64 wt % of iron. It may be confirmed by measuring a thermal expansion coefficient by thermomechanical analysis (TMA) that the invar of the central portion 101 has a constant content.

In the first and second outer portions 102 and 103, the content of nickel may be different depending on a thickness from a surface of a metal plate. The first and second outer portions 102 and 103 may include an interface in which the nickel content changes from a surface of the multi-layered metal plate toward the central portion 101.

At this time, the first outer portion 102 may be classified into a first outer surface portion 102a and a first outer inner surface portion 102b based on the interface in which the nickel content changes.

The second outer portion 103 may be classified into a second outer surface portion 103a and a second outer inner surface portion 103b based on the interface in which the nickel content changes.

The first and second outer portions 102 and 103 may include the first and second outer surface portions 102a and 103a and the first and second outer inner surface portions 102b and 103b. The first outer portion 102 may include the first outer surface portion 102a and the first outer inner surface portion 102b. The second outer portion 103 may include the second outer surface portion 103a and the second outer inner surface portion 103b.

The first and second outer surface portions 102a and 103a may be located on the surface of the multi-layered metal plate, and the first and second outer inner surface portions 102b and 103b may be located between the first and second outer surface portions 102a and 103a and the central portion 101.

The iron content of the first and second outer surface portions 102a and 103a may be smaller than the nickel content of the first and second outer surface portions 102a and 103a. For example, the first and second outer surface portions 102a and 103a may include 100 wt % of nickel. Accordingly, a 100 wt % of nickel layer may be disposed on one side or both sides of the multi-layered metal plate, and an etch rate of a surface thereof may be delayed, thereby improving an etching factor.

The contents of nickel of the first and second outer surface portions 102a and 103a may be different from those of the first and second outer inner surface portions 102b and 103b. The contents of nickel of the first and second outer surface portions 102a and 103a may be greater than those of the first and second outer inner surface portions 102b and 103b.

The first and second outer inner surface portions 102b and 103b may have 36 wt % to 100 wt % of nickel and 0 wt % to 64 wt % of iron. For example, the first and second outer inner surface portions 102b and 103b may have 40 wt % to 100 wt % of nickel and 0 wt % to 60 wt % of iron. For example, the first and second outer inner surface portions 102b and 103b may have 50 wt % to 100 wt % of nickel and 0 wt % to 50 wt % of iron. In detail, the first and second outer inner surface portions 102b and 103b may include predetermined contents of nickel and iron in the weight range.

The contents of nickel of the first and second outer inner surface portions 102b and 103b may be less than those of the first and second outer surface portions 102a and 103a, and may be greater than that of the central portion 101.

The contents of nickel of the first and second outer inner surface portions 102b and 103b may vary depending on thicknesses thereof. For example, in the first and second outer inner surface portions 102b and 103b, the content of nickel in a boundary surface of the first and second outer inner surface portions 102b and 103b and the first and second outer surface portions 102a and 103a may be different from the content of nickel in a boundary surface of the first and second outer inner surface portions 102b and 103b and the central portion 101. For example, in the first and second outer inner surface portions 102b and 103b, the content of nickel may be gradually reduced from the boundary surface of the first and second outer inner surface portions 102b and 103b and the first and second outer surface portions 102a and 103a toward the boundary surface of the first and second outer inner surface portions 102b and 103b and the central portion 101. In detail, as the first outer inner surface portion 102b is located closer to the central portion 101, the content of nickel may be smaller. As the second outer inner surface portion 103b is located closer to the central portion 101, the content of nickel may be smaller.

That is, in a multi-layered metal plate according to an embodiment, a content of nickel may be decreased as goes from a surface of a metal plate toward a center of the metal plate. Here, of course, "being decreased" may be not only a gradual decrease but also a sudden decrease.

In detail, the first and second outer surface portions 102a and 103a may include a portion of about 100 wt % of nickel, and the first and second outer inner surface portions 102b and 103b may include a nickel content between the first and second outer surface portions 102a and 103a and the central portion 101, and the central portion 101 may include 36 wt % of nickel. Accordingly, manufacturing efficiency of a mask for deposition may be excellent due to the low thermal expansion coefficient characteristic of the invar in the central portion, which is a region exceeding 60% of the total thickness. In addition, the outer portion located on the surface of the multi-layered metal plate may be composed of a nickel layer and a layer having a higher nickel content than the invar, thereby uniformly forming a fine through-hole.

The multi-layered metal plate of the embodiment may include a layered structure of a plurality of layers in cross section.

The central portion 101 may include a multi-layered structure. Specifically, the central portion 101 may include a multi-layered plating layer.

The outer portions 102 and 103 may include a multi-layered structure. In detail, the first outer portion 102 and the second outer portion 103 may include the multi-layered structure. More specifically, the first outer surface portion 102a may be a plating layer of at least one layer, and the first outer inner surface portion 102b may be a plating layer of at least one layer. The second outer surface portion 103a may be a plating layer of at least one layer, and the second outer inner surface portion 103b may be a plating layer of at least one layer.

The thickness TI of the central portion 101 may be greater than a thickness TO1 of the first outer portion 102 and a thickness TO2 of the second outer portion 103.

The central portion 101 may occupy a region exceeding 60% of the total thickness of the multi-layered metal plate. For example, the central portion 101 may occupy a region exceeding 70% of the total thickness of the multi-layered metal plate. For example, the central portion 101 may occupy a region exceeding 80% to exceeding 90% of the total thickness of the multi-layered metal plate.

The first outer portion 102 may occupy a region of 20% or less of the total thickness from one surface of the metal plate 100. For example, the first outer portion 102 may occupy a region of 15% or less of the total thickness from one surface of the metal plate 100. For example, the first outer portion 102 may occupy a region of 5% to 10% or less of the total thickness from one surface of the metal plate 100.

The second outer portion 103 may occupy a region of 20% or less of the total thickness from the other surface opposite to the one surface of the metal plate 100. For example, the second outer portion 103 may occupy a region of 15% or less of the total thickness from the other surface opposite to the one surface of the metal plate 100. For example, the second outer portion 103 may occupy a region of 5% to 10% or less of the total thickness from the other surface opposite to the one surface of the metal plate 100.

The first and second outer surface portions 102a and 103a may be a region of 20% or less of the total thickness of the outer portion. For example, the first outer surface portion 102a may be a region of 20% or less of the total thickness of the first outer portion 102. For example, the second outer surface portion 103a may be a region of 20% or less of the total thickness of the second outer portion 103.

The first and second outer surface portions 102a and 103a may be a region of 2% or less of the total thickness TA of the metal plate.

EDS measurement tomography data of a metal plate according to a comparative example and an exemplary embodiment will be described with reference to FIGS. 11 and 12.

FIG. 11 is a view illustrating a composition ratio distribution of dissimilar alloys according to a thickness of a metal plate formed by plating according to a comparative example.

In order to adjust a Ni content to 36%, it may be required to adjust various factors including metal ion concentrations of Fe and Ni having different precipitation region bands. As described above, an initial plating layer having a composition ratio of 64% of iron and 36% of nickel may be formed at 0.1 μm or less. However, when forming a metal plate having a thickness range required for forming a mask for deposition, problems may occur in which the composition ratio of Fe and Ni is not uniform depending on a thickness and/or a position.

For example, when a dissimilar alloy is formed in a thickness of 1 μm to 30 μm, various factors such as surface resistance of a temperature electrode of a liquid bath may directly affect an alloy ratio. Accordingly, in an invar alloy formed by plating and having a thickness of 25 μm, a Fe content measured in a single layer may be 60% to 64% and a Ni content may be 36% to 40%. In detail, the contents of Fe and Ni may have different contents depending on a thickness and/or a position. Accordingly, the invar alloy formed by plating may have a problem that a characteristic of a minimum thermal expansion coefficient of the invar is deteriorated according to non-uniformity of the composition ratio.

FIG. 12 is a view illustrating a composition ratio distribution of a dissimilar alloy according to a thickness of a metal plate heat-treated after multi-step plating according to an embodiment.

In an invar alloy heat-treated after multi-step plating and having a thickness of 25 μm according to the embodiment, a Fe content measured in a single layer may be 64%, a Ni content may be 36%, and the invar alloy may have a uniform content regardless of a thickness and/or a position.

The invar alloy formed according to the embodiment may have a characteristic of a minimum thermal expansion coefficient, which is an advantage of invar, according to the uniformity of the composition ratio.

In order to control abnormal precipitation of iron and nickel that may occur in electroplating, the multi-layered metal plate according to the embodiment may be formed by heat treatment after forming a multi-step plating layer in which different elements are alternately disposed by a continuous plating process.

The embodiment may not form an invar foil through an invar plating solution for forming the invar alloy having a predetermined ratio. Therefore, a composition change of the invar alloy due to various change factors such as supply conditions of an invar plating solution and a supply system of the invar plating solution, a current range in the invar plating solution, a temperature of an invar plating bath, and the like may not be a problem.

That is, the multi-layered metal plate according to the embodiment may prevent the contents of nickel and iron from changing due to abnormal precipitation of iron and nickel. In addition, the multi-layered metal plate according to the embodiment may prevent a change in an alloy ratio due to various change factors such as a change in contents of nickel and iron in a plating layer according to a current density, a change in content of the plating layer according to a composition change of a plating solution, a temperature of a plating bath, a surface resistance of an electrode, and the like.

In the embodiment, since the invar foil is formed by thermal diffusion after repeatedly disposing a thin nickel plating layer maintaining 100% nickel content and a thin iron plating layer maintaining 100% iron content, the invar alloy having a predetermined nickel-iron content of a thickness of 1 μm to 30 μm while depending on a plating process may be manufactured with a high yield, thereby reducing the manufacturing cost of the invar. Further, there is an advantage that it may have a characteristic of low thermal expansion coefficient even though it is formed by plating.

Accordingly, the multi-layered metal plate according to the embodiment may have a thickness of 30 μm or less, and may be invar which is a nickel-iron alloy having a predetermined content at a central portion of a region over 60%. For example, the multi-layered metal plate according to the embodiment may be invar which is a nickel-iron alloy having a predetermined content at a central portion of a region over 80%. For example, the multi-layered metal plate according to the embodiment may be invar which is a nickel-iron alloy having a predetermined content at a central portion of a region over 90%. Of course, the multi-layered metal plate according to the embodiment is not limited to partially including the invar, but may include the invar as a whole.

That is, the embodiment may be formed by plating, thereby solving a problem of lowering an etching factor or etching uniformity of a rolled invar.

In addition, while the embodiment is formed by plating, since the alloy of nickel and iron diffused on the gamma may have a predetermined content %, it may have a characteristic of a low thermal expansion coefficient of the invar while having a thickness of 1 μm m or more. Therefore, the mask for deposition in which a plurality of through-holes are formed in the multi-layered metal plate of the embodiment may manufacture an OLED panel having a uniform deposition pattern.

Further, the outer portion of the multi-layered metal plate according to the embodiment may have a high content of nickel, thereby delaying an etch rate of a surface thereof. Therefore, the etching factor may be improved when manufacturing the mask for deposition.

FIGS. 13 to 16 are views illustrating a manufacturing process of through-holes of a mask for deposition according to an embodiment.

A manufacturing method of a mask for deposition according to an embodiment may include: preparing a multi-layered metal plate; forming a photoresist layer to dispose a first photoresist layer on a first surface of the multi-layered metal plate, and dispose a second photoresist layer on a second surface; and etching to form a through-hole through which a first surface hole of the first surface and a second surface hole of the second surface communicate with each other.

Then, the mask for deposition including a plurality of through-holes may be manufactured by removing the photoresist layers.

First, the preparing of the multi-layered metal plate will be described. In the multi-layered metal plate, an alloy of nickel and iron may be prepared. The multi-layered metal plate may be manufactured by the manufacturing process of FIGS. 6 to 10 described above.

Referring to FIG. 13, the multi-layered metal plate may include a central portion 101 which is invar of 36 wt % of nickel and 64 wt % of iron, a first outer portion 102 which has 36 wt % to 100 wt % of nickel and 0 wt % to 64 wt % of iron, and a second outer portion 103 which has 36 wt % to 100 wt % of nickel and 0 wt % to 64 wt % of iron.

The multi-layered metal plate may be a plurality of alloy layers, a thickness of one alloy layer may be 2 μm or less, and the total thickness of the multi-layered metal plate may be 30 μm or less. Here, the alloy layer may include a layer in which element diffusion occurs by heat treatment after plating. The embodiment may not include a rolling process, and thus manufacturing quality may be excellent even when a metal plate having a thickness of 25 μm or less is manufactured. Specifically, even when the multi-layered metal plate according to the embodiment is manufactured with a thin thickness of 20 μm or less, it may have a characteristic of a low thermal expansion coefficient, and thus there is an advantage in processing characteristics of the mask of deposition.

Then, the forming of a photoresist layer will be described with reference to FIG. 14. A first photoresist layer P1 may be disposed on the first surface 101 of the multi-layered metal plate and a second photoresist layer P2 may be formed on a second surface 102 thereof.

Specifically, a photoresist material may be coated on the first surface 101 and the second surface 102 of the multi-layered metal plate, respectively, and the first photoresist layer P1 and the second photoresist layer P2 may be disposed by an exposure and development process, respectively.

The first photoresist layer P1 and the second photoresist layer P2 are disposed such that widths of open regions are different from each other, so that the width of the first surface hole V1 formed on the first surface 101 and the width of the second surface hole V2 formed on the second surface 102 may be different.

Then, referring to FIG. 15, the etching will be described. In the etching process, the first surface hole V1 of the first surface 101 and the second surface hole V2 of the second surface 102 may be formed and a through-hole may be formed as the first surface hole V1 and the second surface hole V2 communicate with each other by the connecting part CA.

For example, the etching process may be performed by a wet etching process.

Accordingly, the first surface 101 and the second surface 102 may be simultaneously etched. For example, the wet etching process may be performed at about 45° C. by using an etchant containing iron chloride. At this point, the etchant may contain 35 to 45 wt % of $FeCl_3$. Specifically, the etchant may contain 36 wt % of $FeCl_3$. For example, specific gravity of the etchant containing 43 wt % of $FeCl_3$ may be 1.47 at 20° C. The specific gravity of the etchant containing 41 wt % of $FeCl_3$ may be 1.44 at 20° C. The specific gravity of the etchant containing 38 wt % of $FeCl_3$ may be 1.39 at 20° C.

Then, referring to FIG. 16, the first photoresist layer P1 and the second photoresist layer P2 may be removed, and thus the metal plate having a plurality of through-holes may be formed.

In the metal plate used for manufacturing the deposition mask according to an embodiment, an etch rate of the outer portions 102 and 103 may be slower than that of the center portion 101, and thus etching characteristics of the through hole may be excellent. In addition, the OLED panel manufactured by the deposition mask according to the embodiment has excellent deposition efficiency of the pattern and may improve deposition uniformity.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

The above description of the embodiments is merely examples and does not limit the present invention. It would be apparent to those of ordinary skill in the art that the present invention may be easily embodied in many different forms without changing the technical idea or essential features thereof. For example, elements of the exemplary embodiments described herein may be modified and realized. Also, it should be construed that differences related to such changes and applications are included in the scope of the present invention defined in the appended claims.

The invention claimed is:

1. A multi-layered metal plate used for manufacturing a mask for deposition has a thickness of 30 or less, the multi-layered metal plate comprising:
    an alloy of nickel (Ni) and iron (Fe);
    a first outer portion occupying a region of 20% or less of the total thickness from one surface of the multi-layered metal plate;
    a second outer portion occupying a region of 20% or less of the total thickness from the other surface opposite to the one surface; and
    a central portion other than the first outer portion and the second outer portion,
    wherein nickel contents of the first outer portion and the second outer portion are greater than that of the central portion, and the nickel contents of the first and second outer portions are 40 wt % to 100 wt %.

2. The multi-layered metal plate of claim 1, wherein a thickness of the metal plate is 20 μm or less.

3. The multi-layered metal plate of claim 1, wherein the first and second outer portions occupy a region of 5% or more to 10% or less of the total thickness of the one surface and the other surface, respectively.

4. The multi-layered metal plate of claim 1, wherein the content of nickel in the first and second outer portions is 50 wt % to 100 wt %.

5. The multi-layered metal plate of claim 1, wherein the first and second outer portions include first and second outer surface portions and first and second outer inner surface portions, respectively, and
    wherein the first and second outer surface portions include a greater content of nickel than the first and second outer inner surface portions.

6. The multi-layered metal plate of claim 5, wherein the first and second outer surface portions are regions of 20% or less of the total thickness of the first and second outer portions, and
    wherein the contents of iron of the first and second outer surface portions are smaller than those of nickel of the first and second outer surface portions.

7. The multi-layered metal plate of claim 5, wherein the first and second outer inner surface portions include 40 wt % to 100 wt % of nickel and 0 wt % to 60 wt % of iron.

8. The multi-layered metal plate of claim 7, wherein the first and second outer inner surface portions have the content of nickel gradually decreased from a boundary surface of the first and second outer inner surface portions and the first and second outer surface portions toward a boundary surface of the first and second outer inner surface portions and the central portion.

9. The multi-layered metal plate of claim 7, wherein the content of nickel becomes smaller as the first outer inner surface portion and the second outer inner surface portion are closer to the central portion.

10. The multi-layered metal plate of claim 5, wherein the first and second outer surface portions have the content of iron smaller than that of nickel.

11. The multi-layered metal plate of claim 5, wherein the first and second outer surface portions include a portion of 100 wt % of nickel.

12. The multi-layered metal plate of claim 5, wherein the content of nickel of the first and second outer inner surface portions is between the content of nickel of the first and second outer surface portions and the content of nickel of the central portion.

13. The multi-layered metal plate of claim 12, wherein the nickel plating layer and the iron plating layer have a thickness of 2 μm or less.

14. The multi-layered metal plate of claim 1, wherein the central portion is invar of 36 wt % of nickel and 64 wt % of iron.

15. The multi-layered metal plate of claim 1, further comprising two or more alloy layers of nickel (Ni) and iron (Fe),
    wherein a thickness of one of the alloy layers is 2 μm or less.

16. The multi-layered metal plate of claim 1, wherein the first and second outer portions have the contents of nickel varying depending on a thickness from one surface of the metal plate.

17. The multi-layered metal plate of claim 16, wherein the first and second outer portions include an interface in which the content of nickel changes from the surface of the multi-layered metal plate toward the central portion.

18. The multi-layered metal plate of claim 1, wherein the multi-layered metal plate includes a nickel plating layer and an iron plating layer that are alternately disposed, and
    wherein the first and second outer portions include e nickel plating layer.

* * * * *